US011306248B2

(12) United States Patent
Chung et al.

(10) Patent No.: US 11,306,248 B2
(45) Date of Patent: Apr. 19, 2022

(54) SILICON ETCHING SOLUTION, SILICON ETCHING METHOD, AND METHOD OF PRODUCING SILICON FIN STRUCTURE

(71) Applicant: TOKYO OHKA KOGYO CO., LTD., Kawasaki (JP)

(72) Inventors: Ming-Yen Chung, Hsinchu (TW); Masaru Takahama, Hsinchu (TW)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 16/905,163

(22) Filed: Jun. 18, 2020

(65) Prior Publication Data
US 2020/0407636 A1 Dec. 31, 2020

(30) Foreign Application Priority Data

Jun. 28, 2019 (JP) .............................. JP2019-121824

(51) Int. Cl.
*C09K 13/00* (2006.01)
*H01L 21/306* (2006.01)
*H01L 21/02* (2006.01)

(52) U.S. Cl.
CPC ........ *C09K 13/00* (2013.01); *H01L 21/02019* (2013.01); *H01L 21/30604* (2013.01); *H01L 21/30608* (2013.01)

(58) Field of Classification Search
CPC .............. C09K 13/00; H01L 21/30608; H01L 21/30604; H01L 21/02019
See application file for complete search history.

(56) References Cited

U.S. PATENT DOCUMENTS

| | | | | | |
|---|---|---|---|---|---|
| 8,058,220 | B2 * | 11/2011 | Koshiyama | ......... | G03F 7/70983 510/175 |
| 2011/0159447 | A1 * | 6/2011 | Kumagai | ................ | B01F 3/088 430/331 |
| 2013/0181159 | A1 * | 7/2013 | Tsuchiya | ........... | H01L 21/02024 252/79.1 |
| 2013/0183826 | A1 * | 7/2013 | Tsuchiya | ............... | B24B 37/044 438/692 |
| 2016/0340620 | A1 * | 11/2016 | Sun | .................... | H01L 21/02063 |
| 2019/0085240 | A1 * | 3/2019 | Liu | .................... | H01L 21/30604 |

FOREIGN PATENT DOCUMENTS

| | | |
|---|---|---|
| JP | 2009-123798 A | 6/2009 |
| JP | 2010-278371 A | 12/2010 |

* cited by examiner

*Primary Examiner* — Anita K Alanko
(74) *Attorney, Agent, or Firm* — Knobbe Martens Olson & Bear LLP

(57) ABSTRACT

A silicon etching solution including a component which is a quaternary ammonium hydroxide represented by Formula (A-1), and a component which is a nonionic surfactant, in which an HLB value of the quaternary ammonium hydroxide is in a range of 12 to 15; in Formula (A-1), $R^1$ to $R^4$ each independently represent a monovalent hydrocarbon group, and the total number of carbon atoms contained in $R^1$ to $R^4$ is 10 or greater.

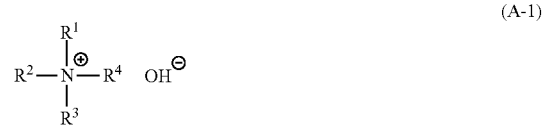

(A-1)

5 Claims, No Drawings

SILICON ETCHING SOLUTION, SILICON ETCHING METHOD, AND METHOD OF PRODUCING SILICON FIN STRUCTURE

BACKGROUND OF THE INVENTION

Field of the Invention

The present invention relates to a silicon etching solution, a silicon etching method, and a method of producing a silicon fin structure.

Priority is claimed on Japanese Patent Application No. 2019-121824, filed on Jun. 28, 2019, the entire content of which is incorporated herein by reference.

Description of Related Art

A technology for miniaturizing semiconductor devices has enabled densification of functional units in the semiconductor devices. For example, a reduction in size of a transistor enables incorporation of more memory elements on a chip and results in production of a product with an increased capacity.

In microfabrication of a substrate for preparing a semiconductor device, a silicon anisotropic etching method using an etching rate that varies depending on the crystal face orientation of a silicon substrate has been used.

In a silicon anisotropic etching method of the related art, an alkali aqueous solution that contains potassium hydroxide and a tetramethylammonium hydroxide (TMAH) has been used as a silicon anisotropic etching solution. Further, in terms of not containing a metal, a silicon anisotropic etching solution that contains TMAH has been suitably used.

For example, PTL 1 discloses a silicon anisotropic etching solution obtained by adding 0.1 to 10 ppm of polyoxyalkylene alkyl ether to a 20 to 25 mass % tetramethylammonium hydroxide aqueous solution; and a silicon anisotropic etching method using the silicon anisotropic etching solution.

Further, PTL 2 discloses a silicon etching solution which anisotropically dissolves single crystal silicon, the aqueous solution containing: hydroxylamine (1), an alkali compound (2), and at least one alkali salt (3) selected from a hydrochloride, a sulfate, a nitrate, an acetate, a propionate, an oxalate, and a succinate of the alkali compound.

CITATION LIST

Patent Literature

[PTL 1] Japanese Unexamined Patent Application, First Publication No. 2010-278371
[PTL 2] Japanese Unexamined Patent Application, First Publication No. 2009-123798

SUMMARY OF THE INVENTION

With further improvement of the technology for miniaturizing semiconductor devices, the etching technology is also required to have higher accuracy.

However, the etching method using an etching solution of the related art as described in Japanese Unexamined Patent Application, First Publication No. 2010-278371 and Japanese Unexamined Patent Application, First Publication No. 2009-123798 has a problem in that the roughness of a surface of a substrate is increased due to etching, and the characteristics (the carrier mobility, the carrier lifetime, and the like) of the semiconductor device are deteriorated. Particularly, in a device with a fine structure such as a fin type transistor (FinFET), an increase in roughness of the surface of a substrate greatly affects the characteristics of a semiconductor device, and thus the characteristics thereof are easily deteriorated.

The present invention has been made in consideration of the above-described circumstances, and an object of the present invention is to provide a silicon etching solution and a silicon etching method, which enable suppression of an increase in roughness of a surface of a substrate after etching.

Further, another object of the present invention is to provide a method of producing a silicon fin structure in which the roughness of a substrate with a surface has been reduced.

In order to achieve the above-described objects, the present invention has employed the following configurations.

That is, according to a first aspect of the present invention, there is provided a silicon etching solution including: a component (A) which is a quaternary ammonium hydroxide represented by Formula (A-1); and a component (C) which is a nonionic surfactant, in which an HLB value of the component (C) is in a range of 12 to 15.

$$R^2 - \overset{R^1}{\underset{R^3}{\overset{|}{N}}} - R^4 \quad OH^{\ominus} \qquad (A\text{-}1)$$

[In the formula, $R^1$ to $R^4$ each independently represent a monovalent hydrocarbon group. Here, the total number of carbon atoms contained in $R^1$ to $R^4$ is 10 or greater.]

According to a second aspect of the present invention, there is provided a silicon etching method, including performing an etching treatment on a silicon substrate using the silicon etching solution according to the first aspect.

According to a third aspect of the present invention, there is provided a method of producing a silicon fin structure, including producing a silicon fin structure using the silicon etching solution according to the first aspect.

According to the silicon etching solution and the silicon etching method of the present invention, it is possible to suppress an increase in roughness of a surface of a substrate after etching.

Further, it is possible to produce a silicon fin structure in which the roughness of a surface of a substrate has been reduced.

DETAILED DESCRIPTION OF THE INVENTION (Silicon Etching Solution)

A silicon etching solution according to a first embodiment of the present invention contains a component (A) which is a quaternary ammonium hydroxide represented by Formula (A-1), and a component (C) which is a nonionic surfactant and has an HLB value of 12 to 15.

<Component (A)>

In the silicon etching solution of the present embodiment, the component (A) is a quaternary ammonium hydroxide represented by Formula (A-1).

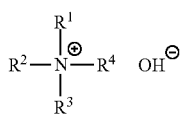

(A-1)

[In the formula, $R^1$ to $R^4$ each independently represent a monovalent hydrocarbon group. Here, the total number of carbon atoms contained in $R^1$ to $R^4$ is 10 or greater.]

In Formula (A-1), $R^1$ to $R^4$ each independently represent a monovalent hydrocarbon group. Examples of the monovalent hydrocarbon group include a monovalent linear or branched alkyl group, a monovalent linear or branched alkenyl group, a monovalent alicyclic hydrocarbon group, and a monovalent aromatic hydrocarbon group.

Examples of the linear alkyl group include those having 1 to 20 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, a tetradecyl group, a pentadecyl group, a hexadecyl group, a heptadecyl group, an octadecyl group, a nonadecyl group, and an icosyl group.

Examples of the branched alkyl group include those having 3 to 20 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Examples of the linear alkenyl group include a vinyl group, a propenyl group (allyl group), and a butynyl group.

Examples of the branched alkenyl group include a 1-methylvinyl group, a 2-methylvinyl group, a 1-methylpropenyl group, and a 2-methylpropenyl group.

Examples of the monovalent alicyclic hydrocarbon group include a monovalent monocyclic alicyclic hydrocarbon group and a monovalent polycyclic alicyclic hydrocarbon group.

Specific examples of the monovalent monocyclic alicyclic hydrocarbon group include a cyclopropyl group, a cyclobutyl group, a cyclopentyl group, a cyclohexyl group, a cycloheptyl group, a cyclooctyl group, a cyclodecyl group, and a cyclododecyl group.

Specific examples of the monovalent polycyclic alicyclic hydrocarbon group include a group in which one hydrogen atom has been removed from a polycycloalkane. Examples of the polycycloalkane include a polycycloalkane having a fused ring polycyclic skeleton such as decalin, perhydroazulene, perhydroanthracene, or a ring structure having a steroid skeleton.

Examples of the monovalent aromatic hydrocarbon group include a group in which one hydrogen atom has been removed from an aromatic ring. The aromatic ring is not particularly limited as long as the aromatic ring is a cyclic conjugated system having (4n+2) π electrons and may be monocyclic or polycyclic.

The number of carbon atoms in the aromatic ring is, for example, in a range of 5 to 30. Specific examples of the aromatic ring include aromatic hydrocarbon rings such as benzene, naphthalene, anthracene, and phenanthrene; and aromatic hetero rings in which some carbon atoms constituting the aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

In Formula (A-1), the above-described monovalent hydrocarbon group can be appropriately selected as $R^1$ to $R^4$ such that the total number of carbon atoms contained in $R^1$ to $R^4$ is set to 10 or greater.

The total number of carbon atoms contained in $R^1$ to $R^4$ is 10 or greater, preferably 12 or greater, and more preferably 16 or greater.

The upper limit of the total number of carbon atoms contained in $R^1$ to $R^4$ is not particularly limited, but is, for example, 20 or less from the viewpoint of water solubility.

In a case where the total number of carbon atoms contained in $R^1$ to $R^4$ is greater than or equal to the above-described lower limit, an increase in roughness of the surface of the substrate after etching can be further suppressed.

Specific examples of the component (A) include a tetrapropylammonium hydroxide (TPAH), a tetrabutylammonium hydroxide (TBAH), a benzyltriethylammonium hydroxide, and a hexadecyltrimethylammonium hydroxide.

Among these, a tetrapropylammonium hydroxide (TPAH) or a tetrabutylammonium hydroxide (TBAH) is preferable, and a tetrabutylammonium hydroxide (TBAH) is more preferable.

The component (A) contained in the silicon etching solution may be used alone or in combination of two or more kinds thereof.

The content of the component (A) is preferably in a range of 0.01% to 15% by mass, more preferably in a range of 0.5% to 10% by mass, and still more preferably in a range of 1% to 5% by mass with respect to the total amount of the silicon etching solution.

In a case where the content of the component (A) is greater than or equal to the lower limit of the above-described preferable range, the effect of etching a substrate (such as a silicon substrate) can be more easily obtained.

In a case where the content of the component (A) is less than or equal to the upper limit of the above-described preferable range, an increase in roughness of the surface of the substrate after etching can be further suppressed.

<Component (C): Nonionic Surfactant>

The component (C) of the present embodiment which is a nonionic surfactant has an HLB value of 12 to 15.

The HLB value of the component (C) is in a range of 12 to 15, preferably in a range of 12.5 to 14, and more preferably in a range of 12.5 to 13.5.

In a case where the HLB value of the component (C) is 12 or greater, the solubility of the component (C) becomes appropriate.

In a case where the HLB value of the component (C) is 15 or less, the effect of etching a substrate (such as a silicon substrate) can be more easily obtained.

In the present specification, the "hydrophile-lipophile balance (HLB)" indicates a value showing the balance between a hydrophilic group and a lipophilic group in a surfactant molecule proposed by Griffin. The HLB value can be experimentally determined by comparing the emulsifying power of various surfactants, but can be typically acquired based on Equation 1.

HLB value=20×formula weight of hydrophilic portion of surfactant/molecular weight of surfactant   Equation 1:

The details of the HLB value are described in "Surfactant Handbook" (1970), p. 178 to 189, co-edited by Koshitami Takahashi, Yoshiro Namba, Motoo Koike, and Masao Kobayashi, published by Kogakutosho, Inc.

Specific examples of the component (C) according to the present embodiment include polyoxyalkylene alkyl ether, polyoxyalkylene alkyl phenyl ether, polyoxyethylene fatty acid ester, polyoxyethylene sorbitan fatty acid ester, polyoxyethylene sorbitol fatty acid ester, glycerin fatty acid ester, and triethanolamine oleate. Among these, polyoxyalkylene alkyl ether is preferable. More specifically, polyoxyethylene alkyl ether is more preferable.

It is preferable that the component (C) of the present embodiment is a compound represented by Formula (C-1).

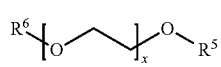

(C-1)

[In Formula, $R^5$ represents a hydrogen atom or a monovalent hydrocarbon group which may have a substituent. $R^6$ represents a monovalent hydrocarbon group which may have a substituent. x represents an integer of 1 to 20.]

In Formula (C-1), $R^5$ represents a hydrogen atom or a monovalent hydrocarbon group which may have a substituent. Examples of the monovalent hydrocarbon group include a linear or branched alkyl group and a cyclic hydrocarbon group.

The linear alkyl group preferably has 1 to 20 carbon atoms, more preferably 3 to 18 carbon atoms, and still more preferably 5 to 15 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, a tetradecyl group, a pentadecyl group, a hexadecyl group, a heptadecyl group, an octadecyl group, a nonadecyl group, and an icosyl group.

The branched alkyl group has preferably 3 to 20 carbon atoms and more preferably 3 to 15 carbon atoms. Specific examples include an isopropyl group, an isobutyl group, a tert-butyl group, an isopentyl group, a neopentyl group, a 1,1-diethylpropyl group, and a 2,2-dimethylbutyl group. Among these, an isopropyl group is more preferred.

In a case where $R^5$ represents a cyclic hydrocarbon group, the cyclic hydrocarbon group may be an aliphatic hydrocarbon group or an aromatic hydrocarbon group and may be a polycyclic group or a monocyclic group.

As the aliphatic hydrocarbon group which is a monocyclic group, a group obtained by removing one hydrogen atom from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable. As the polycycloalkane, a group having 7 to 12 carbon atoms is preferable, and specific examples thereof include adamantane, norbornane, isobornane, tricyclodecane, and tetracyclododecane.

In a case where the cyclic hydrocarbon group as $R^5$ becomes an aromatic hydrocarbon group, the aromatic hydrocarbon group is a hydrocarbon group having at least one aromatic ring.

The aromatic ring is not particularly limited as long as the aromatic ring is a cyclic conjugated system having (4n+2) π electrons and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms.

Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group as $R^5$ include a group in which one hydrogen atom has been removed from the aromatic hydrocarbon ring or aromatic hetero ring (such as an aryl group or a heteroaryl group); a group in which one hydrogen atom has been removed from an aromatic compound having two or more aromatic rings (such as biphenyl, fluorene); and a group in which one hydrogen atom of the aromatic hydrocarbon ring or aromatic hetero ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aromatic hydrocarbon ring or aromatic hetero ring is preferably in a range of 1 to 4, more preferably 1 or 2, and particularly preferably 1.

Among these, as the aromatic hydrocarbon group for $R^5$, a group in which one hydrogen atom has been removed from an aromatic hydrocarbon ring (such as an aryl group) or a group in which one hydrogen atom in the aromatic hydrocarbon ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group) is preferable.

The monovalent hydrocarbon group may have a substituent. Here, the expression "may have a substituent" includes both a case where a hydrogen atom (—H) of the hydrocarbon group is substituted with a monovalent group and a case where a methylene group (—CH$_2$—) of the hydrocarbon group is substituted with a divalent group.

Examples of the substituent in a case where a hydrogen atom (—H) of the hydrocarbon group is substituted with a monovalent group include a monovalent group having a hetero atom (such as a halogen atom, an oxygen atom, a sulfur atom, or a nitrogen atom). Specific examples of the monovalent group include a halogen atom (such as a fluorine atom, a chlorine atom, or a bromine atom), an alkoxy group (a methoxy group, an ethoxy group, a propoxy group, or a butoxy group), an amino group, and —SO$_2$—NH$_2$.

In a case where a methylene group (—CH$_2$—) of the hydrocarbon group is substituted with a divalent group, examples of the monovalent hydrocarbon group which may have a substituent as $R^5$ includes an acyl group (such as an acetyl group, a propionyl group, a benzoyl group, or a benzoyloxy group), and an alkoxy group (such as a methoxy group, an ethoxy group, a propoxy group, or a butoxy group). Further, some or all hydrogen atoms in the acyl group may be substituted with hetero atoms (such as a halogen atom, an oxygen atom, a sulfur atom, or a nitrogen atom). Specifically, $R^5$ may represent a trifluoroacetyl group.

In Formula (C-1), among the examples, it is preferable that $R^5$ represents a hydrogen atom or a monovalent aromatic hydrocarbon group.

In Formula (C-1), $R^6$ represents a monovalent hydrocarbon group which may have a substituent, and examples thereof include the same groups as those for $R^5$ described above.

In Formula (C-1), it is preferable that $R^6$ has a tertiary carbon atom or a quaternary carbon atom in the structure thereof. Typically, it is preferable that $R^6$ represents a monovalent hydrocarbon group containing a branched alkyl group. The monovalent hydrocarbon group containing a branched alkyl group has preferably 8 to 40 carbon atoms and more preferably 10 to 35 carbon atoms.

In Formula (C-1), x represents an integer of 1 to 20 and preferably 5 to 20.

In a case where a compound represented by Formula (C-1) is used as the component (C), the HLB value is represented by Equation 2.

HLB value=20×(44×x/molecular weight of compound represented by Formula(C-1))  Equation 2:

Specific preferred examples of the component (C) according to the present embodiment are described below.

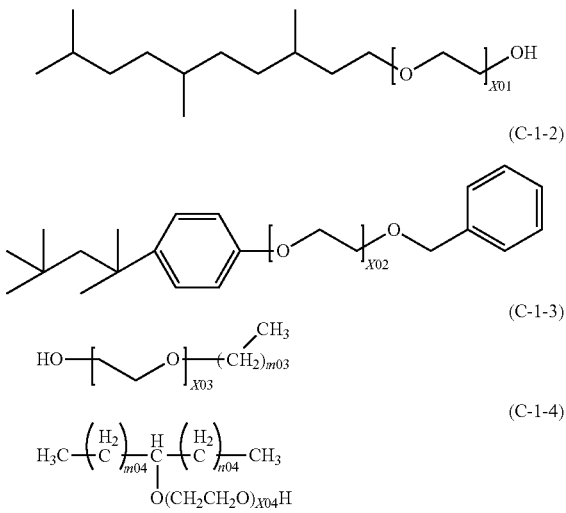

In Formula (C-1-1), X01 represents 7 to 13.
In Formula (C-1-2), X02 represents 11 to 20.
In Formula (C-1-3), m03 represents, for example, 7 to 21 and preferably 9 to 17. X03 represents 5 to 20.

The numbers of m03 and X03 can be appropriately selected such that the HLB value calculated by Equation 1 is in a range of 12 to 15.

In Formula (C-1-4), m04+n04 is, for example, in a range of 7 to 15 and preferably in a range of 9 to 11. X04 represents 5 to 20.

The numbers of m04+n04 and X04 can be appropriately selected such that the HLB value calculated by Equation 1 is in a range of 12 to 15.

The component (C) contained in the silicon etching solution may be used alone or in combination of two or more kinds thereof.

The content of the component (C) is preferably in a range of 1 to 10,000 ppm by mass, more preferably in a range of 5 to 1,000 ppm by mass, and still more preferably in a range of 10 to 500 ppm by mass with respect to the total amount of the silicon etching solution.

In a case where the content of the component (C) is greater than or equal to the lower limit of the above-described preferable range, the precipitation of the component (A) is effectively suppressed.

In a case where the content of the component (C) is less than or equal to the upper limit of the above-described preferable range, it is possible to reduce the influence such as damage to a substrate (such as a silicon substrate) and an etching mask.

<Other Components>

The silicon etching solution of the present embodiment may further contain other components in addition to the component (A) and the component (C) described above. Examples of other components include water or a water-soluble organic solvent (B) and a surfactant other than the component (C).

«Water»

It is preferable that the silicon etching solution of the present embodiment further contains water (B). That is, it is preferable that the silicon etching solution of the present embodiment is an aqueous solution containing the component (A) and the component (C).

As the water (B), pure water, ion exchange water, or the like can be used.

The content of water (B) is not particularly limited, but is preferably 80% by mass or greater, more preferably 90% by mass or greater, still more preferably 94% by mass or greater with respect to the total amount of the silicon etching solution.

Further, the upper limit thereof is not particularly limited, but is preferably less than 99.95% by mass and more preferably 98% by mass or less.

«Water-Soluble Organic Solvent»

The silicon etching solution of the present embodiment may further contain a water-soluble organic solvent.

Examples of the water-soluble organic solvent include an alcohol-based solvent, an ether-based solvent, and a glycol ether-based solvent.

Alcohol-Based Solvent

Specific examples of the alcohol-based solvent include a monohydric alcohol such as methanol, ethanol, n-propanol, isopropanol, n-butanol, isobutanol, sec-butanol, tert-butanol, n-amyl alcohol, isoamyl alcohol, sec-amyl alcohol, or tert-amyl alcohol; and a polyhydric alcohol such as ethylene glycol, propylene glycol, butanediol, 1,5-pentanediol, 1,6-hexanediol, 1,2-hexanediol, 2,4-hexanediol, hexylene glycol, 1,7-heptanediol, octylene glycol, glycerin, or 1,2,6-hexanetriol.

Ether-Based Solvent

Specific examples of the ether-based solvent include diisopropyl ether, diisobutyl ether, diisopentyl ether, di-n-butyl ether, di-n-pentyl ether, di-sec-butyl ether, diisopentyl ether, di-sec-pentyl ether, and di-tert-amyl ether.

Glycol Ether-Based Solvent

Specific examples of the glycol ether-based solvent include ethylene glycol monomethyl ether, ethylene glycol monoethyl ether, ethylene glycol monobutyl ether, diethylene glycol monomethyl ether, diethylene glycol monoethyl ether, diethylene glycol monopropyl ether, and diethylene glycol monobutyl ether.

Among these, an alcohol-based solvent is preferable as the water-soluble organic solvent from the viewpoint of sufficiently improving the solubility of the above-described component (A), particularly, TBAH while suppressing damage to a substrate (such as a silicon substrate) and an etching mask during etching. Specifically, a monohydric alcohol such as isopropanol, n-butanol, isobutanol, or sec-butanol; a dihydric alcohol such as ethylene glycol or propylene glycol; and a trihydric alcohol such as glycerin are preferable, and a dihydric alcohol and a trihydric alcohol are preferable.

The water-soluble organic solvent contained in the silicon etching solution may be used alone or in combination of two or more kinds thereof.

The content of the water-soluble organic solvent is preferably in a range of 1% to 10% by mass, more preferably in a range of 3% to 10% by mass, and still more preferably 3% to 7% by mass with respect to the total amount of the silicon etching solution.

In a case where the content of the water-soluble organic solvent is greater than or equal to the lower limit of the above-described preferable range, the precipitation of the component (A) can be further suppressed.

In a case where the content of the water-soluble organic solvent is less than or equal to the upper limit of the above-described preferable range, it is possible to further reduce damage to a substrate (such as a silicon substrate) and an etching mask.

«Surfactant Other than Component (C)»

The silicon etching solution of the present embodiment may further contain a surfactant other than the component (C). Examples of the surfactant other than the component (C) include a nonionic surfactant, an anionic surfactant, a cationic surfactant, and an amphoteric surfactant, which has an HLB value of less than 12 or greater than 15.

Nonionic Surfactant Having an HLB Value of Less than 12 or Greater than 15

Examples of the nonionic surfactant having an HLB value of less than 12 or greater than 15 include polyoxyalkylene alkyl ether, polyoxyalkylene alkyl phenyl ether, polyoxyethylene fatty acid ester, polyoxyethylene sorbitan fatty acid ester, polyoxyethylene sorbitol fatty acid ester, glycerin fatty acid ester, triethanolamine oleate, and a benzyl phenyl ether-based surfactant.

Anionic Surfactant

The anionic surfactant is not particularly limited, and a known surfactant of the related art which contains an anionic group can be used. Examples of such an anionic surfactant include a surfactant containing a carboxylic acid group, a sulfonic acid group, or a phosphoric acid group as an anionic group.

Specific examples of the anionic surfactant include a higher fatty acid containing an alkyl group with 8 to 20 carbon atoms, higher alkyl sulfuric acid ester, higher alkyl sulfonic acid, higher alkyl aryl sulfonic acid, and other surfactants containing a sulfonic acid group, higher alcohol phosphoric acid ester, and salts thereof. Here, the alkyl group contained in the anionic surfactant may be linear or branched, a phenylene group or an oxygen atom may be interposed in a branched chain, and some hydrogen atoms contained in the alkyl group may be substituted with hydroxyl groups or carboxyl groups.

Specific examples of the higher fatty acid include dodecanoic acid, tetradecanoic acid, and stearic acid. Further, specific examples of the higher alkyl sulfuric acid ester include decyl sulfuric acid ester and dodecyl sulfuric acid ester. In addition, examples of the higher alkyl sulfonic acid include decane sulfonic acid, dodecane sulfonic acid, tetradecane sulfonic acid, pentadecane sulfonic acid, and stearic sulfonic acid.

Specific examples of the higher alkylaryl sulfonic acid include dodecylbenzene sulfonic acid and decylnaphthalene sulfonic acid.

Examples of other surfactants containing a sulfonic acid group include alkyl diphenyl ether disulfonic acid such as dodecyl diphenyl ether disulfonic acid; and dialkyl sulfosuccinate such as dioctyl sulfosuccinate.

Examples of the higher alcohol phosphoric acid ester include palmityl phosphoric acid ester, castor oil alkyl phosphoric acid ester, and coconut oil alkyl phosphoric acid ester.

Cationic Surfactant

Specific examples of the cationic surfactant include a quaternary ammonium salt and an alkylamine salt.

Amphoteric Surfactant

Specific examples of the amphoteric surfactant include a betaine type surfactant, an amino acid type surfactant, an imidazoline type surfactant, and an amine oxide type surfactant.

The surfactant other than the component (C) described above may be used alone or in combination of two or more kinds thereof.

The content of the surfactant other than the component (C) is not particularly limited and is, for example, in a range of 1 to 10,000 ppm by mass.

The silicon etching solution of the present embodiment is used for performing an etching treatment on an object to be treated which contains silicon. Specific examples of the object to be treated include a silicon germanium (SiGe) substrate which is a silicon alloy, in addition to a silicon (Si) substrate.

Further, in a case where the description is made using a silicon (Si) substrate as an example, a silicon oxide film such as a natural oxide film, a thermal oxide film, or a vapor phase synthetic film (such as a CVD film) may be formed on the surface thereof.

The applications of the substrate are not particularly limited, and examples thereof include various substrates used for applications such as a semiconductor wafer, a glass substrate for a photomask, a glass substrate for a liquid crystal display, a glass substrate for a plasma display, a substrate for a field emission display (FED), a substrate for an optical disk, a substrate for a magnetic disk, and a substrate for a magneto-optical disk. Among these, a substrate used for preparing a semiconductor device is preferable as the substrate.

The size, the thickness, the shape, the layer structure, and the like of the substrate are not particularly limited and can be appropriately selected depending on the purpose.

The silicon etching solution of the present embodiment described above contains the component (A) which is a specific quaternary ammonium hydroxide and the component (C) which is a nonionic surfactant having an HLB value of 12 to 15. An increase in roughness of the surface of the substrate after etching can be suppressed by combining the component (A) and the component (C) described above. The reason for this is not clear, but the component (A) is considered to have an appropriate basicity because the component (A) contains a plurality of monovalent hydrocarbon groups and the total number of carbon atoms in the hydrocarbon group is 10 or greater. Further, since the HLB of the component (C) is in a specific range, the stability of adsorption to the surface of the substrate (such as a silicon substrate) can be improved. Therefore, it is assumed that the surface of the substrate can be uniformly subjected to an etching treatment by combining these.

(Silicon Etching Method)

According to a second embodiment of the present invention, there is provided a silicon etching method of performing an etching treatment on a silicon substrate using the silicon etching solution according to the first embodiment described above.

Further, the silicon substrate is a substrate containing silicon, and examples thereof include a silicon germanium (SiGe) substrate.

Further, a substrate having a surface on which a silicon oxide film such as a natural oxide film, a thermal oxide film, or a vapor phase synthetic film (such as a CVD film) is formed may be used.

[Etching Treatment]

Examples of the method of performing an etching treatment on a silicon substrate include a spray method, an immersion method (dip method), and a liquid puddle method (paddle method).

The spray method is a method of transporting or rotating a silicon substrate in a predetermined direction, spraying the silicon etching solution according to the first embodiment to the space, and bringing the silicon etching solution into contact with the silicon substrate. Further, the silicon etching solution may be sprayed while the substrate rotates using a spin coater as necessary.

The immersion method (dip method) is a method of immersing a silicon substrate in the silicon etching solution according to the first embodiment and bringing the silicon etching solution into contact with the silicon substrate.

The liquid puddle method (paddle method) is a method of raising the silicon etching solution according to the first embodiment on a silicon substrate using the surface tension and maintaining the state for a certain period of time.

The various methods of performing an etching treatment can be appropriately selected according to the structure, the material, and the like of the silicon substrate. In a case of the spray method or the liquid puddle method (paddle method), the amount of the silicon etching solution according to the first embodiment which is supplied to the silicon substrate may be an amount at which the surface of the silicon substrate to be treated is sufficiently wetted with the silicon etching solution.

In a case where microfabrication is performed on the silicon substrate in the above-described etching treatment, typically, a site that should not be etched is coated with an etching mask, and the silicon etching solution is brought into contact with the silicon substrate. Here, examples of the etching mask include a silicon oxide film such as a natural oxide film, a thermal oxide film, or a vapor phase synthetic film (such as a CVD film).

The temperature of performing the etching treatment is not particularly limited and is, for example, in a range of 25° C. to 70° C.

The time of performing the etching treatment is not particularly limited, and is appropriately selected according to the structure and the material of the silicon substrate and the etching treatment conditions.

In the silicon etching method of the present embodiment, since the dissolution rate of the silicon substrate (component (A)) in the silicon etching solution according to the first embodiment varies depending on the face orientation of the silicon substrate, the etching proceeds with the anisotropy.

The silicon etching method of the present embodiment may include a washing step, a rinsing step, and a drying step in addition to the above-described etching treatment. The washing step and the rinsing step may be performed before and/or after the etching treatment described above. The drying step may be performed after the washing step or the rinsing step or after the washing step and the rinsing step.

«Washing Step»

The washing step is a step of washing the surface of the silicon substrate in advance.

The washing method is not particularly limited, and a known RCA washing method is exemplified as a method of washing a semiconductor substrate. In the RCA washing method, first, a substrate is immersed in a solution containing hydrogen peroxide and ammonium hydroxide, and fine particles and organic substances are removed from the substrate. Next, the substrate is immersed in a hydrofluoric acid aqueous solution so that a natural oxide film on the surface of the substrate is removed. Thereafter, the substrate is immersed in an acidic solution of a solution containing hydrogen peroxide and dilute hydrochloric acid so that alkali ions and metal impurities which are insoluble in the mixed solution of hydrogen peroxide and ammonium hydroxide are removed.

«Rinse Step»

The rinsing step is a step of rinsing the surface of the silicon substrate with a rinsing liquid described later. The rinsing method is not particularly limited, and a method which has been typically used for washing a substrate in a semiconductor manufacturing step can be employed. Examples of such a method include a method of immersing a substrate in a rinsing liquid, a method of bringing the vapor of a rinsing liquid into contact with a substrate, and a method of supplying a rinsing liquid to a substrate while spinning the substrate. Among these, the method of supplying a rinsing liquid to a substrate while spinning the substrate is preferable as the rinsing method. According to the method described above, the rotation speed of the spinning is, for example, in a range of 100 rpm to 5000 rpm.

Rinsing Liquid

The rinsing liquid used in the rinsing step is not particularly limited, and a liquid which has been typically used for a rinsing step of a semiconductor substrate can be used. Examples of the rinsing liquid include those containing an organic solvent. Examples of the organic solvent include hydrocarbons, esters, ethers, ketones, halogen-containing solvents, sulfoxide-based solvents, alcohols, polyhydric alcohol derivatives, and nitrogen-containing compound solvents.

The rinsing liquid may contain water in place of or in addition to the organic solvent.

The rinsing liquid may contain known additives and the like. Examples of known additives include fluorine-based surfactants and silicone-based surfactants.

Specific examples of the fluorine-based surfactants include commercially available fluorine-based surfactants such as BM-1000 and BM-1100 (both manufactured by B.M-Chemie Co., Ltd.), MEGAFAC F142D, MEGAFAC F172, MEGAFAC F173, and MEGAFAC F183 (all manufactured by DIC Corporation), FLUORAD FC-135, FLUORAD FC-170C, FLUORAD FC-430, and FLUORAD FC-431 (all manufactured by Sumitomo 3M Ltd.), SURFLON S-112, SURFLON S-113, SURFLON S-131, SURFLON S-141, and SURFLON S-145 (all manufactured by AGC Inc.), and SH-28PA, SH-190, SH-193, SZ-6032, and SF-8428 (all manufactured by Toray-Dow Corning Silicone Co., Ltd.), but the present invention is not limited thereto.

Specific preferred examples of the silicone-based surfactants include an unmodified silicone-based surfactant, a polyether-modified silicone-based surfactant, a polyester-modified silicone-based surfactant, an alkyl-modified silicone-based surfactant, an aralkyl-modified silicone-based surfactant, and a reactive silicone-based surfactant.

As the silicone-based surfactant, a commercially available silicone-based surfactant can be used. Specific examples of the commercially available silicone-based surfactant include PAINTAD M (manufactured by Dow Corning Toray Co., Ltd.), TOPICA K1000, TOPICA K2000, and TOPICA K5000 (all manufactured by Takachiho Sangyo Co., Ltd.), XL-121 (manufactured by Clariant AG, polyether-modified silicone-based surfactant), and BYK-310 (manufactured by Big Chemie Japan Co., Ltd., polyester-modified silicone-based surfactant).

«Drying Step»

The drying step is a step of drying the silicon substrate. By performing the drying step, the rinsing liquid remaining on the silicon substrate after the rinsing step can be efficiently removed.

The method for drying the silicon substrate is not particularly limited, and a known method such as spin drying, heat drying, hot air drying, or vacuum drying can be used. Suitable examples thereof include spin drying under a condition of blowing inert gas (such as nitrogen gas).

According to the silicon etching method of the present embodiment described above, an increase in roughness of the surface of the substrate after etching can be suppressed.

(Method of Producing Silicon Fin Structure)

According to a third aspect of the present invention, there is provided a method of producing a silicon fin structure, including producing a silicon fin structure using the silicon etching solution according to the first aspect.

Examples of the method of producing the silicon fin structure according to the present embodiment include a method including a step of performing an etching treatment on a silicon substrate using the silicon etching solution according to the first embodiment described above. As described above, since etching proceeds with anisotropy due to the step, a fin type structure (silicon fin structure) can be produced.

Specific examples of the silicon fin structure include a silicon substrate having a fin type structure (silicon fin substrate).

Specific examples of the method of producing the silicon fin structure according to the present embodiment include the following method.

(i) First, an etching mask is formed on the surface of the silicon substrate. Here, examples of the etching mask include a silicon oxide film such as a natural oxide film, a thermal oxide film, or a vapor phase synthetic film (such as a CVD film).

(ii) Next, a resist film is formed on the surface of the etching mask using a known resist composition. Further, a resist pattern is formed by sequentially performing an exposure treatment, a development treatment, a bake treatment (post-bake), and the like on the resist film.

(iii) Next, the resist pattern is transferred to the etching mask according to a dry etching method such as a reactive ion etching (RIE) method. Thereafter, the entire resist film is removed. In this manner, a silicon substrate which is partially covered with the etching mask and whose surface is partially exposed is obtained.

(iv) Thereafter, a silicon fin substrate is obtained using the above-described silicon etching method according to the second embodiment.

Further, other examples of the method of producing the silicon fin structure includes the following method.

The steps (i) and (ii) described above are performed to form a silicon fin structure having a rough surface using a dry etching method in the step (iii). Thereafter, a silicon fin structure with a reduced surface roughness can be obtained by performing an etching (trimming) treatment to the extent that the surface roughness of the silicon fin structure with a rough surface is eliminated using the silicon etching method according to the second embodiment described above. In this manner, even a silicon fin structure having a small fin thickness can also be prepared.

According to the method of producing the silicon fin structure of the present embodiment, a silicon fin structure with a reduced surface roughness can be produced.

EXAMPLE

Hereinafter, the present invention will be described in more detail based on examples, but the present invention is not limited to these examples.

<Preparation of Silicon Etching Solution>

Each component listed in Tables 1 and 2 was mixed with water (approximately 98% by mass) to prepare a silicon etching solution of each example. In addition, the total amount of the silicon etching solution is 100% by mass with each component and water listed in Tables 1 and 2.

TABLE 1

| | Component (A) | Component (C) | HLB |
|---|---|---|---|
| Example 1 | TBAH [2.0% by mass] | (C)-1 [50 ppm by mass] | 13.3 |
| Example 2 | TPAH [2.0% by mass] | (C)-1 [50 ppm by mass] | 13.3 |
| Example 3 | TBAH [2.0% by mass] | (C)-2 [50 ppm by mass] | 14.5 |
| Example 4 | TBAH [2.0% by mass] | (C)-3 [50 ppm by mass] | 12.6 |
| Example 5 | TBAH [2.0% by mass] | (C)-4 [50 ppm by mass] | 13.0 |
| Example 6 | TBAH [2.0% by mass] | (C)-5 [50 ppm by mass] | 13.3 |

TABLE 2

| | Quaternary ammonium hydroxide | Surfactant | HLB |
|---|---|---|---|
| Comparative Example 1 | TBAH [2.0% by mass] | — | — |
| Comparative Example 2 | TMAH [2.0% by mass] | (C)-1 [50 ppm by mass] | 13.3 |
| Comparative Example 3 | Al-1 [2.0% by mass] | (C)-1 [50 ppm by mass] | 13.3 |
| Comparative Example 4 | Al-2 [2.0% by mass] | (C)-1 [50 ppm by mass] | 13.3 |
| Comparative Example 5 | Al-3 [2.0% by mass] | (C)-1 [50 ppm by mass] | 13.3 |
| Comparative Example 6 | TBAH [2.0% by mass] | Su-1 [50 ppm by mass] | 18.0 |
| Comparative Example 7 | TBAH [2.0% by mass] | Su-2 [50 ppm by mass] | 10.6 |
| Comparative Example 8 | TBAH [2.0% by mass] | Su-3 [50 ppm by mass] | — |
| Comparative Example 9 | TBAH [2.0% by mass] | Su-4 [50 ppm by mass] | — |

In Table 1, each abbreviation has the following meaning.

TBAH: Tetrabutylammonium hydroxide

TPAH: Tetrapropylammonium hydroxide

TMAH: Tetramethylammonium hydroxide

Al-1: 2-Hydroxyethyltrimethylammonium hydroxide (choline)

Al-2: Bis(2-hydroxyethyl) dimethylammonium hydroxide

Al-3: Tris(2-hydroxyethyl) methylammonium hydroxide (C)-1: compound represented by Formula (C1-1) (trade name: TDK9, manufactured by Oriental Union Chemical Corporation)

(C)-2: compound represented by Formula (C1-2) (trade name: TDK12, manufactured by Oriental Union Chemical Corporation)

(C)-3: compound having HLB value of 12.6 which is represented by Formula (C1-3) (trade name: Triton (registered trademark) CF10, manufactured by The Dow Chemical Company)

(C)-4: compound represented by Formula (C1-4) (trade name: SINOPOL 1109, manufactured by Sino-Japan Chemical Co., Ltd. (Taiwan))

(C)-5: compound represented by Formula (C1-5) (trade name: SOFTANOL (registered trademark) 90, manufactured by Nippon Shokubai Co., Ltd.)

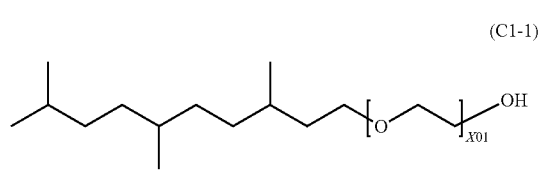
(C1-1)

[In the formula, X01 represents 9.]

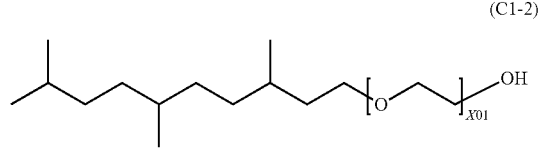
(C1-2)

[In the formula, X01 represents 12.]

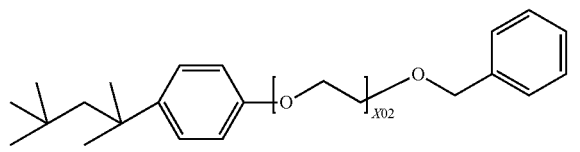
(C1-3)

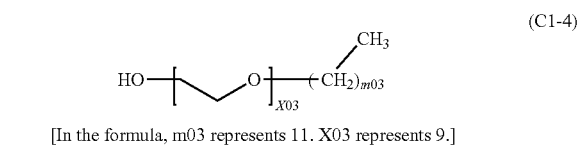
(C1-4)

[In the formula, m03 represents 11. X03 represents 9.]

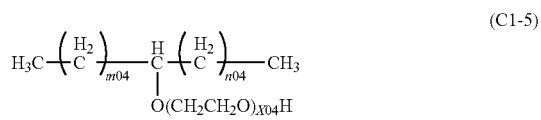
(C1-5)

[In the formula, m04+n04 is in a range of 9 to 11. X04 represents 9.]

Su-1: compound represented by Formula (Su-1) (trade name: TDK40, manufactured by Oriental Union Chemical Corporation)

Su-2: nonionic surfactant having HLB value of 10.6 (trade name: Triton (registered trademark) DF12, manufactured by The Dow Chemical Company)

Su-3: benzyl dodecyl dimethyl ammonium chloride

Su-4: compound represented by Formula (Su-4) (trade name: PIONIN MA-1600, manufactured by Takemoto Oil & Fat Co., Ltd.)

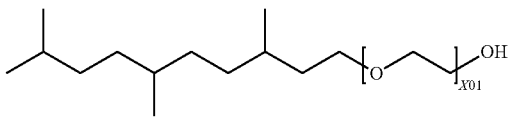
(Su-1)

[In the formula, X01 represents 40.]

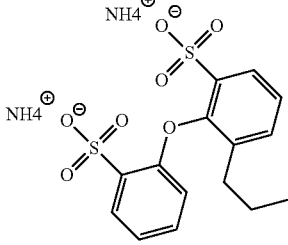
(Su-4)

[Evaluation of Surface Roughness]

In Regard to Object to be Treated

The object to be treated is a single crystal silicon (100) (also simply referred to as silicon (100)) wafer. This silicon (100) wafer was cut into a size of 2×2 cm for use.

The silicon (100) wafer was immersed in a 0.5% hydrofluoric acid aqueous solution at room temperature for 1.5 minutes immediately before the etching treatment, rinsed with ultrapure water, and dried.

The treatment was performed after the silicon natural oxide film which had been generated on the surface of the silicon (100) wafer was removed by the hydrofluoric acid aqueous solution treatment.

Evaluation Method

The silicon etching solution of each example was poured into a polyethylene container, the container was immersed in a water bath, and the temperature of the silicon etching solution was increased to 40° C. An etching treatment was performed by immersing the silicon (100) wafer described above in the silicon etching solution at 40° C. for 3 minutes. Next, the silicon (100) wafer was taken out, rinsed with ultrapure water, and dried. The surface of the etched portion of the silicon (100) wafer on which the etching treatment was performed was observed with an atomic force microscope (AFM) (Dimension Icon, manufactured by Bruker Corporation), and the root mean square roughness (surface roughness) Rq (nm) per 1 μm square was acquired. The results were evaluated based on the following criteria, and the evaluation results are listed in Tables 3 and 4.

The surface roughness of the silicon (100) wafer before the etching treatment was performed was 0.22 nm.

(Evaluation of Surface Roughness)

A: less than 0.35 nm

B: 0.35 nm or greater and less than 0.40 nm

C: 0.40 nm or greater and less than 0.45 nm

D: 0.45 nm or greater

TABLE 3

| Surface roughness | |
|---|---|
| Example 1 | A |
| Example 2 | C |
| Example 3 | B |
| Example 4 | A |
| Example 5 | B |
| Example 6 | A |

TABLE 4

| Surface roughness | |
|---|---|
| Comparative Example 1 | D |
| Comparative Example 2 | D |
| Comparative Example 3 | D |
| Comparative Example 4 | D |
| Comparative Example 5 | D |
| Comparative Example 6 | D |
| Comparative Example 7 | D |
| Comparative Example 8 | D |
| Comparative Example 9 | D |

Based on the results listed in Tables 3 and 4, it can be confirmed that the silicon etching solutions of Examples 1 to 6 can suppress an increase in roughness of the surface of the substrate after etching, as compared with the silicon etching solutions of Comparative Examples 1 to 9.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A silicon etching solution comprising:
   a component (A) which is a quaternary ammonium hydroxide represented by Formula (A-1); and
   a component (C) which is a nonionic surfactant,
   wherein an HLB value of the component (C) is in a range of 12 to 15,
   wherein the component (C) is a compound represented by Formula (C-1-1):

(A-1)

wherein $R^1$ to $R^4$ each independently represents a monovalent hydrocarbon group, and the total number of carbon atoms contained in $R^1$ to $R^4$ is 10 or greater

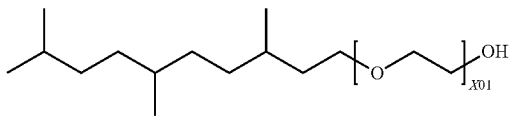

(C1-1)

wherein X01 represents an integer of 7 to 13.

2. The silicon etching solution according to claim 1, wherein the HLB value of the component (C) is in a range of 12.5 to 14.

3. The silicon etching solution according to claim 1, wherein the component (A) is one or more compounds selected from the group consisting of tetrapropylammonium hydroxide, tetrabutylammonium hydroxide, benzyltriethylammonium hydroxide, and hexadecyltrimethylammonium hydroxide.

4. A silicon etching method comprising performing an etching treatment on a silicon substrate using the silicon etching solution according to claim 1.

5. A method of producing a silicon fin structure, comprising producing a silicon fin structure using the silicon etching solution according to claim 1.

* * * * *